United States Patent
Kondo et al.

(10) Patent No.: US 9,991,331 B2
(45) Date of Patent: Jun. 5, 2018

(54) APPARATUSES AND METHODS FOR SEMICONDUCTOR CIRCUIT LAYOUT

(71) Applicant: Micron Technology, Inc., Boise, ID (US)

(72) Inventors: Harunobu Kondo, Akita (JP); Kenichi Echigoya, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/276,365

(22) Filed: Sep. 26, 2016

(65) Prior Publication Data
US 2018/0090557 A1 Mar. 29, 2018

(51) Int. Cl.
| H01L 21/02 | (2006.01) |
| H01L 49/02 | (2006.01) |
| H01L 27/02 | (2006.01) |
| H01L 23/528 | (2006.01) |

(52) U.S. Cl.
CPC ............ *H01L 28/60* (2013.01); *H01L 23/528* (2013.01); *H01L 27/0203* (2013.01)

(58) Field of Classification Search
CPC ........................................................ H01L 28/60
USPC ......................................................... 257/532
See application file for complete search history.

(56) References Cited

U.S. PATENT DOCUMENTS

| 8,847,353 B2 | 9/2014 | Hasunuma |
| 8,853,822 B2 | 10/2014 | Katagiri et al. |
| 2003/0227330 A1* | 12/2003 | Khanifar ............... H03F 1/0261 330/302 |
| 2007/0121275 A1* | 5/2007 | Takashima ............... H01G 4/30 361/311 |
| 2010/0060322 A1* | 3/2010 | Coenen .............. H03K 19/0013 326/103 |
| 2010/0065944 A1 | 3/2010 | Tu et al. |
| 2010/0230734 A1* | 9/2010 | Shimizu ............. H01L 27/0207 257/300 |
| 2012/0153436 A1 | 6/2012 | Hasunuma |
| 2013/0015558 A1 | 1/2013 | Nishizaki et al. |
| 2013/0062733 A1* | 3/2013 | Summerfelt ...... H01L 27/11507 257/532 |

(Continued)

FOREIGN PATENT DOCUMENTS

| JP | 2009231831 A | 10/2009 |
| JP | 2013-110314 | 6/2013 |
| KR | 2010095242 A | 8/2010 |

OTHER PUBLICATIONS

International Search Report and Written Opinion dated Nov. 15, 2017 for Application Number PCT/US2017/045744, pp. all.

*Primary Examiner* — Igwe U Anya
(74) *Attorney, Agent, or Firm* — Dorsey & Whitney LLP

(57) ABSTRACT

Apparatuses including compensation capacitors are described. An example apparatus includes: first, second and third capacitors arranged such that the second capacitor is sandwiched between the first and third capacitors, each of the first, second and third capacitors including first and second electrodes. The first electrodes of the first, second and third capacitors are electrically coupled in common to one another. The second electrodes of the first and third capacitors are electrically coupled in common to each other. The second electrode of the second capacitor is electrically insulated from the second electrodes of the first and third capacitors.

20 Claims, 11 Drawing Sheets

(56) References Cited

U.S. PATENT DOCUMENTS

2015/0221718 A1* 8/2015 Rhie ................. H01L 28/90
257/534
2015/0288173 A1* 10/2015 Chen ................ H01L 27/0248
361/56

* cited by examiner

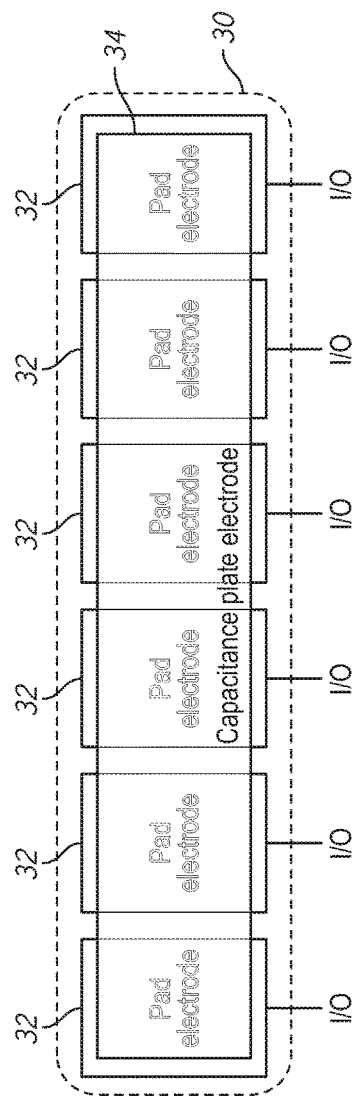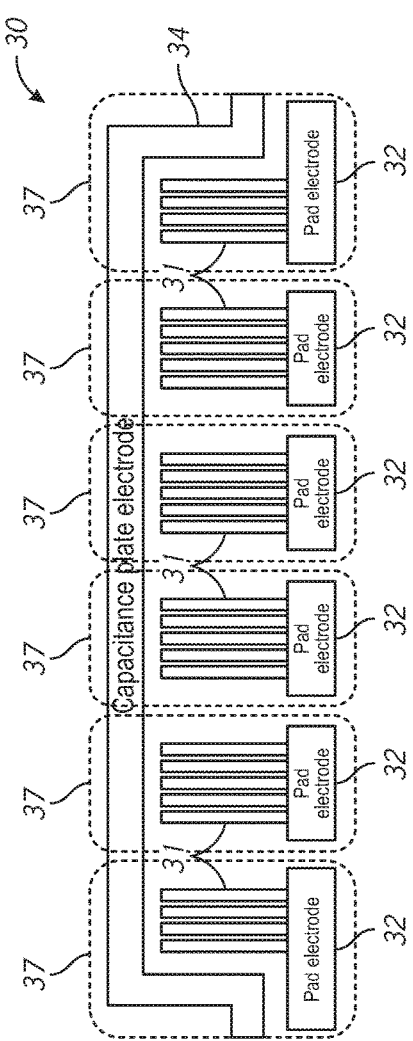
FIG. 3A
FIG. 3B

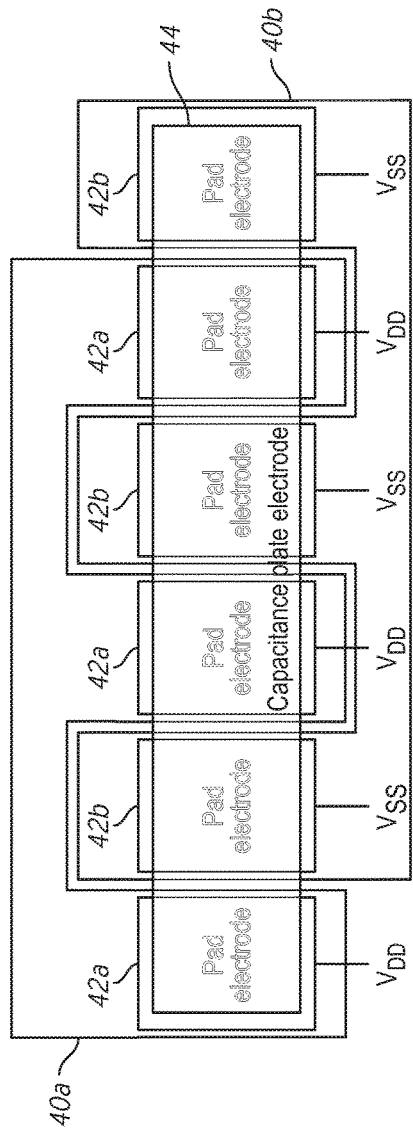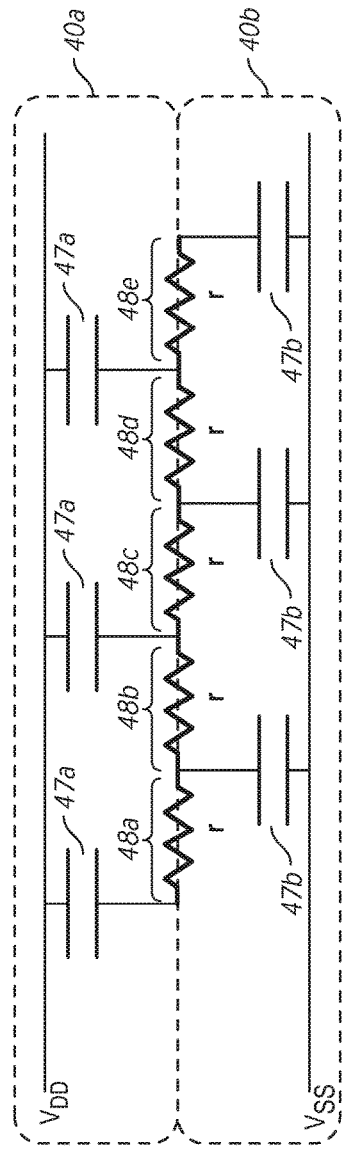
FIG. 4A
FIG. 4B

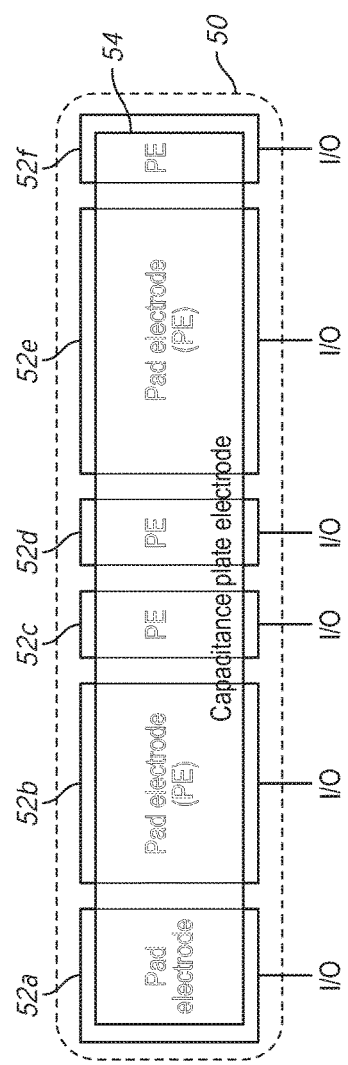
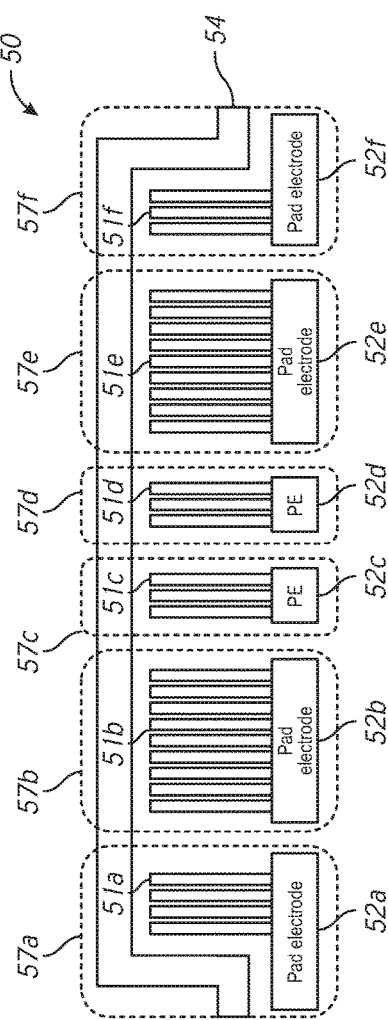
FIG. 5A
FIG. 5B

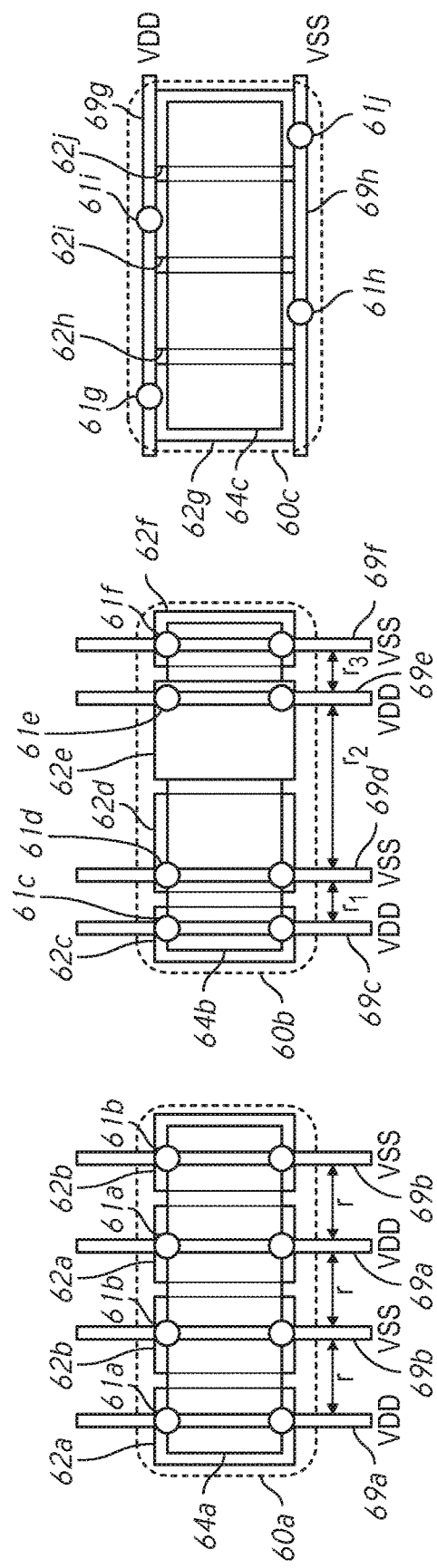

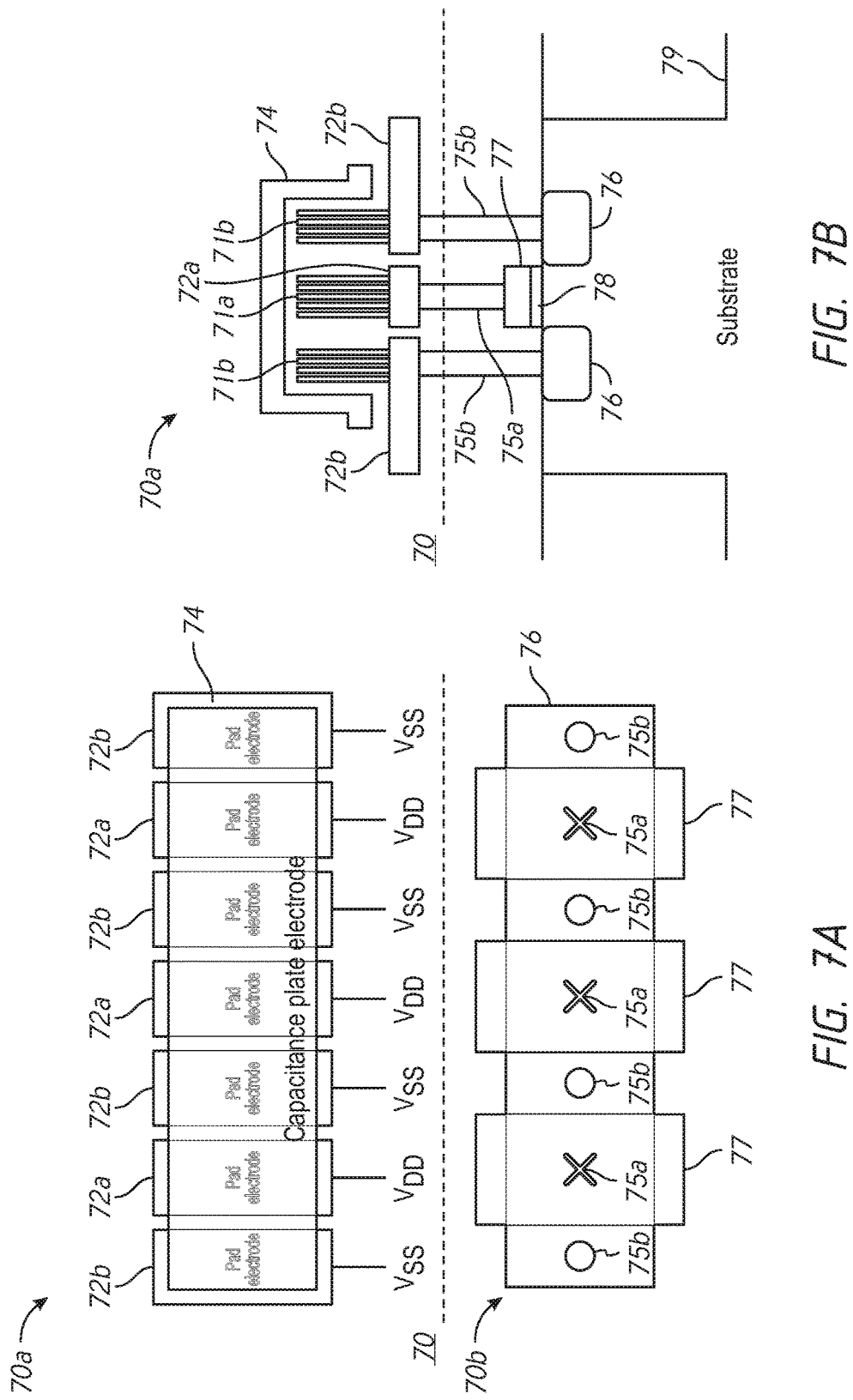

APPARATUSES AND METHODS FOR SEMICONDUCTOR CIRCUIT LAYOUT

BACKGROUND

High operation reliability and reduced chip size are features that are demanded from semiconductor memory. In recent years, there has been an effort to improve operation reliability for semiconductor devices while reducing power consumption. As part of that effort to improve the data reliability, stable power supply in the semiconductor devices has been playing an important role.

Generally, a semiconductor device (e.g., a semiconductor chip) may provide a power supply voltage internally or may distribute an external power supply voltage. For example, the semiconductor device may include a power supply circuit and a voltage detection circuit that detects voltage drop due to in-chip circuit operation. The power supply circuit may provide the power supply voltage responsive to the voltage drop to stabilize the power supply voltage, however such response of the power supply circuit may have a delay relative to the voltage drop, and some instability in the power supply voltage due to voltage drop during the delay may remain. The instability throughout the semiconductor device (e.g., a voltage between a gate node and a source node of transistors in the semiconductor device) may cause noise on circuits on the semiconductor device. To reduce such noise, a compensation capacitance element for compensating the power supply voltage may be provided between power supply lines having a positive power supply voltage $V_{DD}$ and a negative power supply voltage Vss (e.g., a ground level, etc.).

For example, a compensation capacitance element including capacitors where each capacitor has a structure similar to a structure of a capacitor in a memory cell. The compensation capacitance element may have a current leakage when a voltage difference between one end and the other end of the compensation capacitance element exceeds a threshold voltage. In order to prevent the current leakage, a plurality of compensation capacitance elements coupled in series may be provided to have a voltage difference lower than the threshold voltage for each compensation capacitance element. The plurality of compensation capacitance elements may have resistance at intermediate nodes between the plurality of compensation capacitance elements. If the resistance at the intermediate nodes exceeds a threshold resistance, a current may become too weak to compensate the power supply voltage. When the capacitance to be obtained by the plurality of compensation capacitance elements is large while fitting the plurality of compensation capacitance elements in a limited space of the semiconductor device, the resistance may become too high.

For example, a wire may be inserted in parallel to the series of compensation capacitance elements to reduce the resistance at the intermediate nodes, however, the wire may occupy an extra space. Alternatively, the compensation capacitance elements may be divided, however, a manner of dividing may depend on arrangements of the capacitors in the compensation capacitance elements. Furthermore, dividing each compensation capacitance element into a plurality of compensation capacitance elements in parallel may reduce the resistance at the intermediate nodes, however, dividing into the plurality of compensation capacitance elements in parallel requires extra spaces for margins between the plurality of compensation capacitance elements.

BRIEF DESCRIPTION OF THE DRAWINGS

FIG. 3A is a simplified layout diagram of a capacitance block in the semiconductor chip in accordance with an embodiment of the present disclosure.

FIG. 3B is a simplified structural diagram of the capacitance block of FIG. 3A.

FIG. 4A is a simplified layout diagram of a plurality of capacitance blocks in the semiconductor chip in accordance with an embodiment of the present disclosure.

FIG. 4B is a simplified circuit diagram of the plurality of capacitance blocks in the semiconductor chip in accordance with an embodiment of the present disclosure.

FIG. 5A is a simplified layout diagram of a capacitance block in the semiconductor chip in accordance with an embodiment of the present disclosure.

FIG. 5B is a simplified structural diagram of the capacitance block of FIG. 5A.

FIG. 6A is a simplified layout diagram of a capacitance block in the semiconductor chip in accordance with an embodiment of the present disclosure.

FIG. 6B is a simplified layout diagram of a capacitance block in the semiconductor chip in accordance with an embodiment of the present disclosure.

FIG. 6C is a simplified layout diagram of a capacitance block in the semiconductor chip in accordance with an embodiment of the present disclosure.

FIG. 7A is a simplified layout diagram of a peripheral circuit region in the semiconductor chip in accordance with an embodiment of the present disclosure.

FIG. 7B is a simplified sectional structural diagram of the peripheral circuit region of FIG. 7A.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
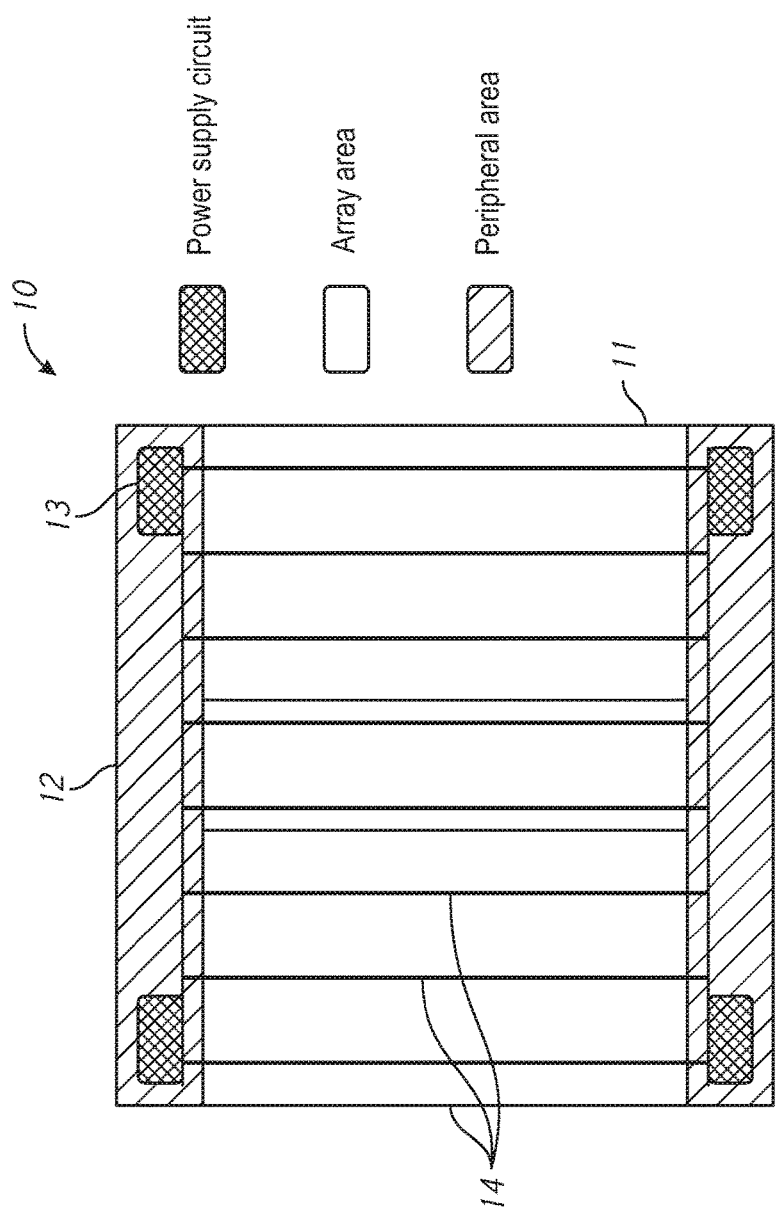
FIG. 1 is a simplified layout diagram of a semiconductor chip in accordance with an embodiment of the present disclosure.

FIG. 1 is a simplified layout diagram of a semiconductor chip in accordance with an embodiment of the present disclosure. The semiconductor chip 10 may include array areas 11 and peripheral areas 12. For example, the semiconductor chip 10 may include power supply circuits 102 that may provide a power supply voltage on the peripheral areas. The semiconductor chip 10 may also include power supply lines 14 disposed on the array areas 11 and the peripheral areas 12, which may provide the power supply voltage throughout the semiconductor chip 10.

Figure 2A:
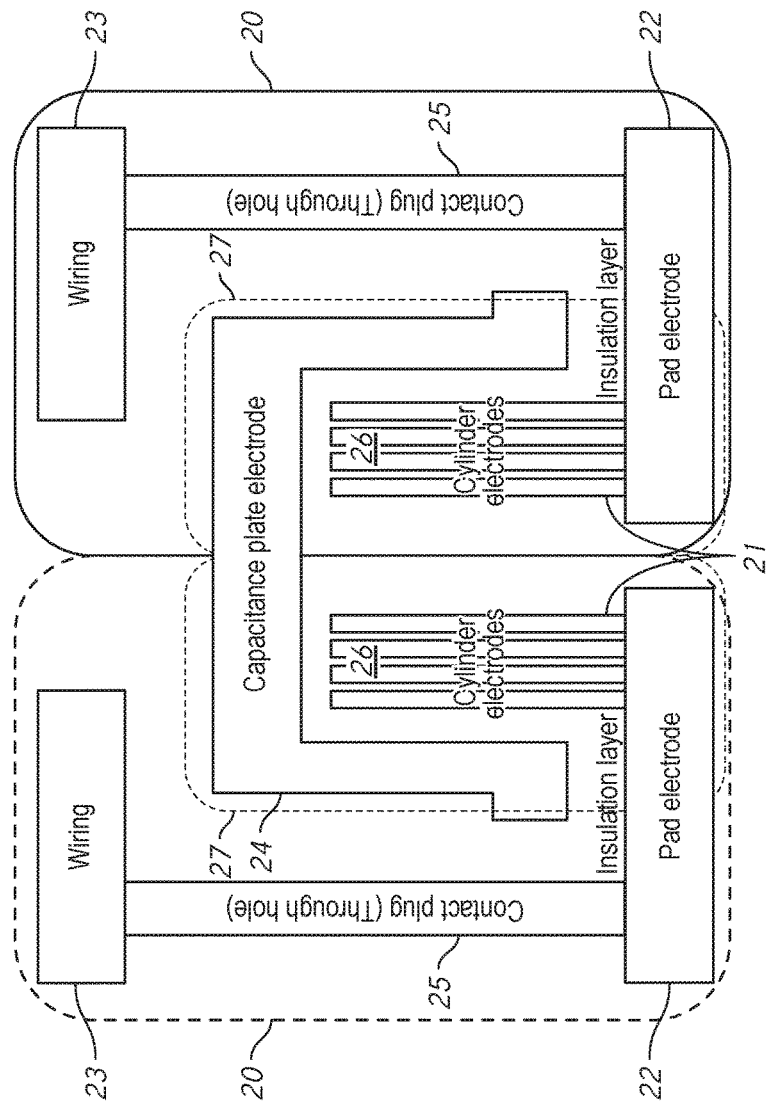
FIG. 2A is a simplified structural diagram of a plurality of capacitance blocks in series in the semiconductor chip in accordance with an embodiment of the present disclosure.
Figure 2B:
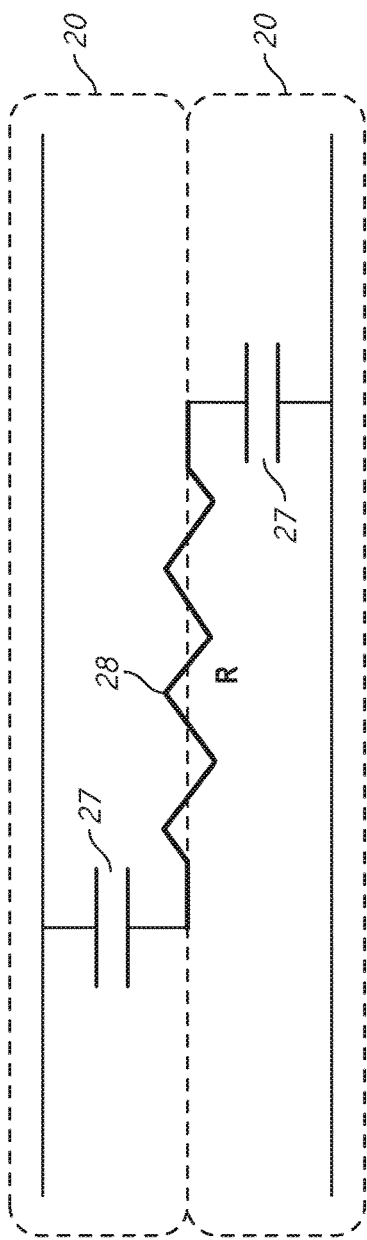
FIG. 2B is a simplified circuit diagram of the plurality of capacitance blocks in series of FIG. 2A.

FIG. 2A is a simplified structural diagram of a plurality of capacitance blocks 20 in series in the semiconductor chip 10 in accordance with an embodiment of the present disclosure. In each capacitance block 20, a plurality of electrodes 21 are disposed on a pad electrode 22 and coupled to the pad electrode 22. For example, the plurality of electrodes 21 may be cylindrical electrodes that is formed as an electrode film in cylinder shapes by depositing a metal film using a chemical vapor deposition (CVD) method. A material of the plurality of electrodes 21 may include, for example, titanium nitride (TiN). For example, a number of the plurality of electrodes 21 disposed on each pad electrode 22 may be 8000 or more. Each of the plurality of capacitance blocks 20 may be disposed on each of the plurality of the pad electrodes 22. Alternatively, one or more of the plurality of capacitance blocks 20 may be disposed on one pad electrode 22. Each of the plurality of capacitance blocks 20 may include a wiring 23 and a contact plug 25 that couples the wiring 23 to a capacitance plate electrode 24 and to the pad electrode 22. In this manner, the capacitance plate electrode 24 may be coupled to a plurality of wirings 23 of the plurality of capacitance blocks 20. The plurality of capacitance blocks 20 may include an insulation layer 26 between the capacitance plate electrode 24 and the plurality of cylindrical electrodes 21. For example, the insulation layer 26 may be a dielectric film interposed between the capacitance plate electrode 24 and the plurality of cylindrical electrodes 21. A material of the dielectric film may include, for example, a high dielectric material, such as zirconium oxide ($ZrO_2$), hafnium oxide ($HfO_2$), and aluminum oxide ($Al_2O_3$), or a lamination thereof. For example, the dielectric film can be formed by an atomic layer deposition (ALD) method. Each of the plurality of electrodes 21 and the capacitance plate electrode 24 may form each of a plurality of capacitors 27. One or more wirings of the plurality of wirings 23 may be coupled to a power supply line 14 in FIG. 1 which may provide a positive power supply $V_{DD}$ and the other wirings of the wirings 23 may be coupled to a power supply line 14 which may provide a negative power supply Vss. FIG. 2B is a simplified circuit diagram of the plurality of capacitance blocks in series of FIG. 2A. Each capacitance block 20 may include a capacitor 27. Each of a plurality of capacitors 27 may be formed by the capacitance plate electrode 24 and the plurality of electrodes 21 on the pad electrode 22 as shown in FIG. 2A. The capacitance plate electrode 24 may include a node 28, which may function as a resistor having a resistance value R between the plurality of capacitors 27.

FIG. 3A is a simplified layout diagram of a capacitance block 30 in the semiconductor chip 10 in accordance with an embodiment of the present disclosure. FIG. 3B is a simplified structural diagram of the capacitance block 30 of FIG. 3A. The capacitance block 30 may be coupled to a plurality of input/output (I/O) lines. Each of a plurality of pad electrodes 32 may be coupled to a wiring (not shown) that is coupled to either the power supply line 14 providing $V_{DD}$ or the power supply line providing Vss. In each capacitance block 30, a plurality of electrodes 31 are disposed on the plurality of pad electrodes 32 and coupled to the plurality of pad electrodes 32, instead of one pad electrode. For example, a number of the plurality of pad electrodes 32 may be three or more. For example, the plurality of electrodes 31 may be cylindrical electrodes that are formed as an electrode film in cylinder shapes by depositing a metal film using the CVD method and the material of the plurality of electrodes 31 may include, for example, titanium nitride (TiN). The plurality of electrodes 31 on each of the plurality of pad electrodes 32 and the capacitance plate electrode 34 may form each of a plurality of capacitors 37.

FIG. 4A is a simplified layout diagram of a plurality of capacitance blocks 40a and 40b in the semiconductor chip 10 in accordance with an embodiment of the present disclosure. FIG. 4B is a simplified circuit diagram of the plurality of capacitance blocks 40a and 40b in the semiconductor chip in accordance with an embodiment of the present disclosure. The capacitance block 40a may be a first capacitor circuit coupled to the power supply line 14 providing $V_{DD}$ and the capacitance block 40b may be a second capacitor circuit coupled to the power supply line providing Vss. The capacitance block 40a and the capacitance block 40b may be coupled in series. For example, a plurality of pad electrodes 42a may be coupled in common to the power supply line 14 providing $V_{DD}$ to receive $V_{DD}$, and a plurality of pad electrodes 42b may be coupled in common to the power supply line providing Vss to receive Vss. In the capacitance block 40a, a plurality of electrodes (not shown) are disposed on the plurality of pad electrodes 42a and coupled to the plurality of pad electrodes 42a, instead of one pad electrode. For example, a number of the plurality of pad electrodes 42a may be three or more. In the capacitance block 40b, a plurality of electrodes (not shown) are disposed on the plurality of pad electrodes 42b and coupled to the plurality of pad electrodes 42b, instead of one pad electrode. For example, a number of the plurality of pad electrodes 42b may be three or more. The plurality of pad electrodes 42a and the plurality of pad electrodes 42b are disposed in a manner that each of the plurality of pad electrodes 42a is adjacent to one or more pad electrodes 42b and each of the plurality of pad electrodes 42b is adjacent to one or more pad electrodes 42a. The plurality of electrodes on each of the plurality of pad electrodes 42a and the plurality of electrodes on each of the plurality of pad electrodes 42b may be electrically insulated from each other. The plurality of electrodes on each of the plurality of pad electrodes 42a in the capacitance block 40a and the capacitance plate electrode 44 may form each of a plurality of capacitors 47a. The plurality of electrodes on each of the plurality of pad electrodes 42b in the capacitance block 40b and the capacitance plate electrode 44 may form each of a plurality of capacitors 47b. Thus, each capacitor 47b is may be disposed adjacent to one or more capacitors 47a coupled in parallel to each other, and may be sandwiched between the adjacent capacitors 47a. The capacitance plate electrode 44 may include a plurality of nodes 48a to 48e that may function as a plurality of resisters having a resistance value r between the capacitors 47a and the capacitors 47b. For example, the resistance value r may be smaller than the resistance value R in FIG. 2B because a distance between adjacent capacitors 47a and 47b represented by each node of the plurality of nodes 48a to 48e may be shorter than a distance between the capacitors 27 represented by the node 28.

FIG. 5A is a simplified layout diagram of a capacitance block 50 in the semiconductor chip 10 in accordance with an embodiment of the present disclosure. FIG. 5B is a simplified structural diagram of the capacitance block 50 of FIG. 5A. The capacitance block 50 may be coupled to a plurality of input/output (I/O) lines. For example, a plurality of pad electrodes 52a to 52f may be arranged in order and may have different sizes, depending on circuitry. Each of the plurality of pad electrodes 52a to 52f may be coupled to a wiring (not shown) that is coupled to either the power supply line 14 providing $V_{DD}$ or the power supply line providing Vss. In each capacitance block 50, a plurality of electrodes 51a to 51f may be disposed on the plurality of pad electrodes 52a to 52f and coupled to the plurality of pad electrodes 52a to 52f, respectively. For example, a number of the plurality of pad electrodes 52a to 52f may be three or more. For example, the plurality of electrodes 51a to 51f may be cylindrical electrodes that are formed as an electrode film in cylinder shapes by depositing a metal film using the CVD method and the material of the plurality of electrodes 51a to 51f may include, for example, titanium nitride (TiN). Numbers of cylindrical electrodes in the plurality of electrodes 51a to 51f may vary according to the sizes of the corresponding pad electrodes 52a to 52f. The plurality of electrodes 51a to 51f on the plurality of pad electrodes 52a to 52f and the capacitance plate electrode 54 may form a plurality of respective capacitors 57a to 57f.

FIG. 6A is a simplified layout diagram of a capacitance block 60a in the semiconductor chip 10 in accordance with an embodiment of the present disclosure. The capacitance block 60a may be coupled to a power supply line 69a extending in a first direction (e.g., vertical in FIG. 6A) and providing $V_{DD}$. The capacitance block 60a may be coupled to a power supply line 69b extending in the first direction and providing Vss. The power supply lines 69a and 69b may be the power supply lines 14 in FIG. 1. Each of a plurality of pad electrodes 62a may be coupled to one or more wirings 61a that are coupled to the power supply line 69a providing $V_{DD}$ and each of a plurality of pad electrodes 62b may be coupled to one or more wirings 61b that are coupled to the power supply line 69b providing Vss. A plurality of electrodes (not shown) on each of the plurality of pad electrodes 62a and 62b, and a capacitance plate electrode 64a may form each of a plurality of capacitors (not shown) in the capacitance block 60a.

In the capacitance block 60a, the plurality of pad electrodes 62a and 62b may have the same size and may be arranged in a second direction (e.g., horizontal in FIG. 6A) substantially perpendicular to the first direction, in a manner that each of the plurality of pad electrodes 62a is adjacent to one or more pad electrodes 62b and each of the plurality of pad electrodes 62b is adjacent to one or more pad electrodes 62a. The power supply lines 69a may be disposed in a manner that each of the power supply lines 69a passes the one or more wirings 61a on the pad electrode 62a and each of the power lines 69a may have a predetermined distance r from one or more adjacent power supply lines 69b. Similarly, the power supply lines 69b may be disposed in a manner that each of the power supply lines 69b passes the one or more wirings 61b on the pad electrode 62b and each of the power lines 69b may have a predetermined distance r from one or more adjacent power supply lines 69a.

FIG. 6B is a simplified layout diagram of a capacitance block 60b in the semiconductor chip 10 in accordance with an embodiment of the present disclosure. In the capacitance block 60b, a plurality of pad electrodes 62c to 62f may be arranged in order and may have different sizes. The capacitance block 60b may be coupled to a plurality of power supply lines 69c and 69e providing $V_{DD}$ and a plurality of power supply lines 69d and 69f providing Vss. The power supply lines 69c to 69f may be the power supply lines 14 in FIG. 1. The pad electrodes 62c and 62e may be coupled to corresponding wirings 61c and 61e that are coupled to the corresponding power supply lines 69c and 69e providing $V_{DD}$ and the pad electrodes 62d and 62f may be coupled to corresponding wirings 61d and 61f that are coupled to the corresponding power supply lines 69d and 69f providing Vss.

The power supply lines 69c may be disposed in a manner that each of the power supply lines 69c passes the one or more wirings 61c on the pad electrode 62c. The power supply lines 69d may be disposed in a manner that each of the power supply lines 69d passes the one or more wirings 61c on the pad electrode 62d. The power supply lines 69e may be disposed in a manner that each of the power supply lines 69e passes the one or more wirings 61e on the pad electrode 62e. The power supply lines 69f may be disposed in a manner that each of the power supply lines 69f passes the one or more wirings 61f on the pad electrode 62f. The power supply lines 69c and 69d may be adjacent to each other with a distance $r_1$. The power supply lines 69d and 69e may be adjacent to each other with a distance $r_2$. The power supply lines 69e and 69f may be adjacent to each other with a distance $r_3$. Here, the distances $r_1$, $r_2$ and $r_3$ may be different to each other. A plurality of electrodes (not shown) on each of the plurality of pad electrodes 62c to 62f, and a capacitance plate electrode 64 may form each of a plurality of capacitors (not shown) in the capacitance block 60b.

FIG. 6C is a simplified layout diagram of a capacitance block 60c in the semiconductor chip 10 in accordance with an embodiment of the present disclosure. The capacitance block 60c may be coupled to a power supply line 69g providing $V_{DD}$ and a power supply line 69h providing Vss. The power supply lines 69g and 69h may be the power supply lines 14 in FIG. 1. A plurality of pad electrodes 62g and 62i may be coupled to a plurality of corresponding wirings 61g and 61i that are commonly coupled to the power supply line 69g providing $V_{DD}$ and a plurality of pad electrodes 62h and 62j may be coupled to a plurality of corresponding wirings 61h and 61j that are commonly coupled to the power supply line 69h providing Vss. A plurality of electrodes (not shown) on each of the plurality of pad electrodes 62g to 62j and a capacitance plate electrode 64c may form each of a plurality of capacitors (not shown) in the capacitance block 60c.

In the capacitance block 60c, a plurality of pad electrodes 62g to 62j may be arranged in order. The power supply line 69g may pass the wirings 61g and 61i on the pad electrodes 62g and 62i, while passing over areas corresponding to the pad electrodes 62h and 62j without coupling to the pad electrodes 62h and 62j. The power supply line 69h may pass the wirings 61h and 61j on the pad electrodes 62h and 62j, while passing over areas corresponding to the pad electrodes 62g and 62i without coupling to the pad electrodes 62g and 62i.

FIG. 7A is a simplified layout diagram of a peripheral circuit region 70 in the semiconductor chip 10 in accordance with an embodiment of the present disclosure. FIG. 7B is a simplified sectional structural diagram of the peripheral circuit region 70 of FIG. 7A. For example, a metal-oxide semiconductor (MOS) transistor 70a (e.g., a MOS capacitor) of a planar type may be formed as a MOS transistor 70b. However, a MOS transistor having a trench gate electrode, or a vertical MOS transistor may also be used. For example, the peripheral circuit region 70 (e.g., one of the peripheral areas 12 in FIG. 1) may have a structure in which the MOS transistor 70b is disposed below a capacitance block 70a.

In a capacitance block 70a of the peripheral circuit region 70, each of a plurality of pad electrodes 72a may be coupled to a wiring (not shown) that is coupled to the power supply line 14 providing $V_{DD}$ and each of a plurality of pad electrodes 72b may be coupled to a wiring (not shown) that is coupled to the power supply line 14 providing Vss. In the capacitance block 70a, a plurality of electrodes 71a are disposed on the plurality of pad electrodes 72a and coupled to the plurality of pad electrodes 72a, and a plurality of electrodes 71b are disposed on the plurality of pad electrodes 72b and coupled to the plurality of pad electrodes 72b. The plurality of pad electrodes 72a and the plurality of pad electrodes 72b are arranged in a manner that each of the plurality of pad electrodes 72a is adjacent to one or more pad electrodes 72b and each of the plurality of pad electrodes 72b is adjacent to one or more pad electrodes 72a. The plurality of electrodes on each of the plurality of pad electrodes 72a and 72b and a capacitance plate electrode 74 may form each of a plurality of capacitors (not shown).

In the peripheral circuit region 70, a gate insulator 78, a gate electrode 77 of the MOS transistor 70b formed on the gate insulator 78, an impurity diffusion layer 76 formed by introducing an N-type impurity into a substrate 79 may be disposed. The impurity diffusion layer 76 may serve as a source or drain electrode of the MOS transistor 70b. Although the MOS transistor 70b of N-channel type is only illustrated by way of example in the peripheral circuit region 70, an N-type well can be formed in the substrate 1, and a MOS transistor of P-channel type can be disposed thereon. Gate contact plugs 75a may couple the gate electrodes 77 and the pad electrodes 72a that are coupled to the power supply line 14 providing $V_{DD}$. Peripheral contact plugs 75b may couple the impurity diffusion layer 76 and the pad electrodes 72b that are coupled to the power supply line 14 providing $V_{SS}$. The gate contact plugs 75a and the peripheral contact plugs 75b may be disposed below the pad electrodes 72a and 72b, respectively, with circuitry flexibility.

Figures 8A, 8B:
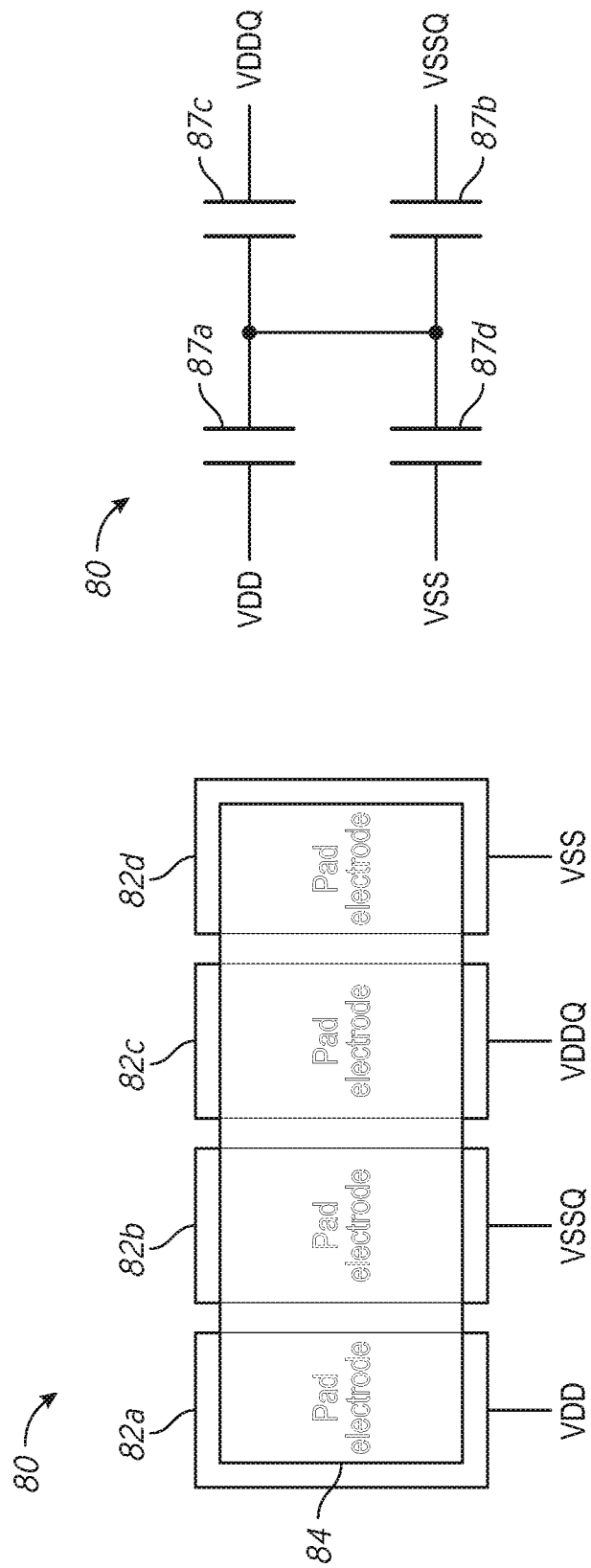
FIG. 8A is a simplified layout diagram of a capacitance block in the semiconductor chip in accordance with an embodiment of the present disclosure.
FIG. 8B is a simplified circuit diagram of the capacitance block in the semiconductor chip in accordance with an embodiment of the present disclosure.

FIG. 8A is a simplified layout diagram of a capacitance block 80 in the semiconductor chip 10 in accordance with an embodiment of the present disclosure. FIG. 8B is a simplified circuit diagram of the capacitance block 80 in the semiconductor chip in accordance with an embodiment of the present disclosure. For example, a plurality of pad electrodes 82a to 82d may be arranged in order to form the capacitance block 80 with a capacitance plate electrode 84. The pad electrode 82a may be coupled to a power supply line providing $V_{DD}$ and may form a compensation capacitor 87a with the capacitance plate electrode 84. The pad electrode 82b may be coupled to a power supply line providing $V_{SSQ}$, and may form a compensation capacitor 87b with the capacitance plate electrode 84. The pad electrode 82c may be coupled to a power supply line providing $V_{DDQ}$ and may form a compensation capacitor 87c with the capacitance plate electrode 84. The pad electrode 82d may be coupled to a power supply line providing Vss and may form a compensation capacitor 87d with the capacitance plate electrode 84. Thus, the capacitance block 80 may provide capacitance between two power supply voltages among a plurality of power supply voltages, possibly more than two power supply voltages.

Figures 9A, 9B, 9C:
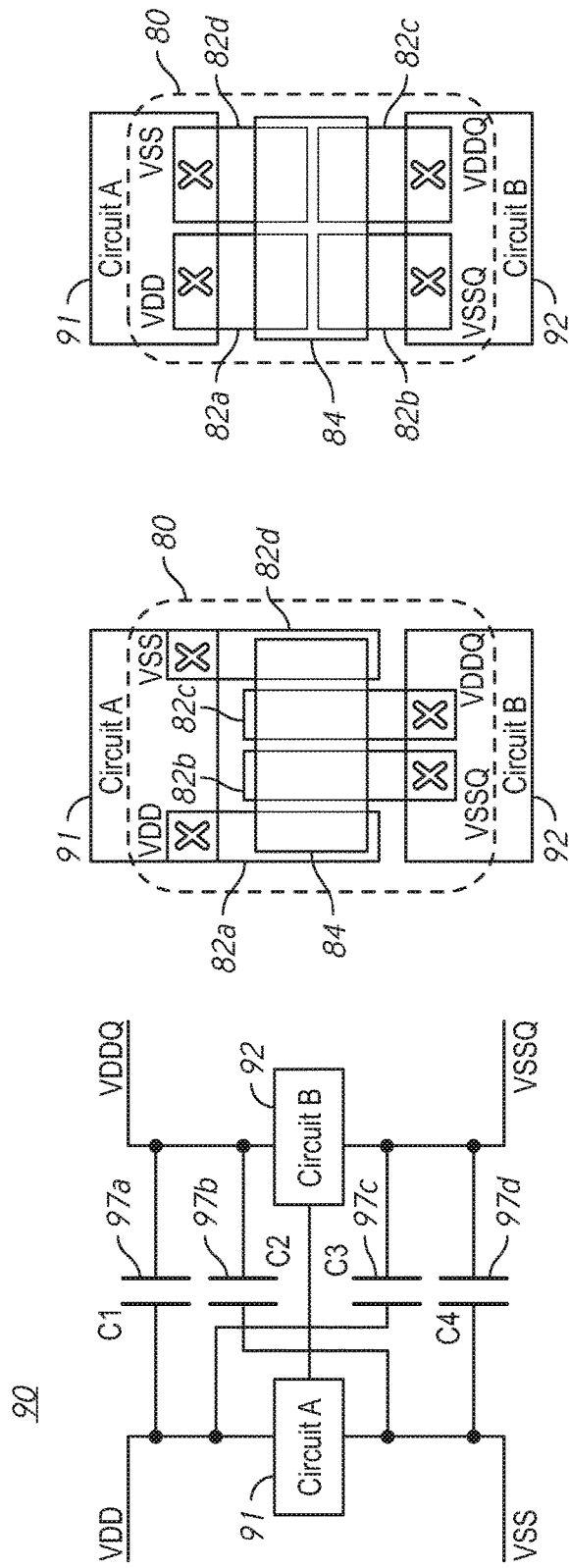
FIG. 9A is a circuit diagram of an apparatus including a plurality of circuits in accordance with an embodiment of the present disclosure.
FIGS. 9B and 9C are simplified layout diagrams of the apparatus including the plurality of circuits of FIG. 9A and the capacitance block in FIG. 8A, in accordance with an embodiment of the present disclosure.

FIG. 9A is a circuit diagram of an apparatus 90 including a plurality of circuits 91 and 92 in accordance with an embodiment of the present disclosure. A circuit (Circuit A) 91 may receive a positive power supply voltage $V_{DD}$ and a negative power supply voltage Vss, and a circuit (Circuit B) 92 may receive a positive power supply voltage $V_{DDQ}$ and a negative power supply voltage $V_{SSQ}$. In order to reduce noise between the plurality of circuits 91 and 92, compensation capacitors 97a to 97d may be provided. For example, the compensation capacitor 97a may be formed by the compensation capacitors 87a and 87c in the capacitance block 80. The compensation capacitor 97b may be formed by the compensation capacitors 87c and 87d in the capacitance block 80. The compensation capacitor 97c may be formed by the compensation capacitors 87a and 87b in the capacitance block 80. The compensation capacitor 97d may be formed by the compensation capacitors 87b and 87d in the capacitance block 80.

FIGS. 9B and 9C are simplified layout diagrams of the apparatus 90 including the plurality of circuits 91 and 92 of FIG. 9A and the capacitance block 80 in FIG. 8A, in accordance with an embodiment of the present disclosure. The pad electrodes 82a and 82d may be coupled to the circuit 91, and may be further coupled to the positive power supply voltage $V_{DD}$ and the negative power supply voltage Vss, respectively. The pad electrodes 82b and 82c may be coupled to the circuit 92 and may be further coupled to the negative power supply voltage $V_{SSQ}$ and the positive power supply voltage $V_{DDQ}$, respectively. In FIG. 9B, for example, the plurality of pad electrodes 82a to 82d may be aligned corresponding to the capacitance plate electrode 84 and arranged in order in a first direction substantially perpendicular to a second direction that is an arrangement direction of the plurality of circuits 91 and 92. The pad electrodes 82a and 82d may be shifted towards the circuit 91, in order to couple the pad electrodes 82a and 82d to the circuit 91. The pad electrodes 82b and 82c may be shifted towards the circuit 92, in order to couple the pad electrodes 82b and 82c to the circuit 92. In FIG. 9C, for example, the plurality of pad electrodes 82a to 82d may not be arranged in order. Instead, the plurality of pad electrodes 82a and 82d may be arranged in a first direction substantially perpendicular to a second direction that is an arrangement direction of the plurality of circuits 91 and 92. The plurality of pad electrodes 82a and 82b may be arranged in the second direction, and the plurality of pad electrodes 82d and 82c may be arranged in the second direction. The plurality of pad electrodes 82b and 82c may be arranged in the first direction. In this manner, the capacitance plate electrode 84 having a center at an intersection of the plurality of pad electrodes 82a to 82d may form a plurality of capacitors with the plurality of pad electrodes 82a and 82d.

Figure 10A:
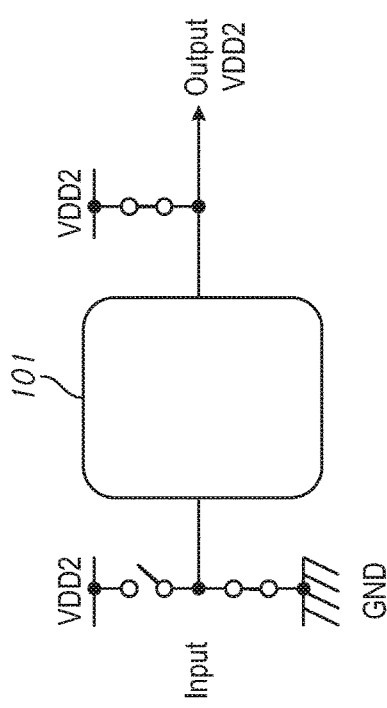
FIGS. 10A and 10B are simplified circuit diagrams of a capacitance block operating as a charge pump, in accordance with an embodiment of the present disclosure.
Figure 10B:
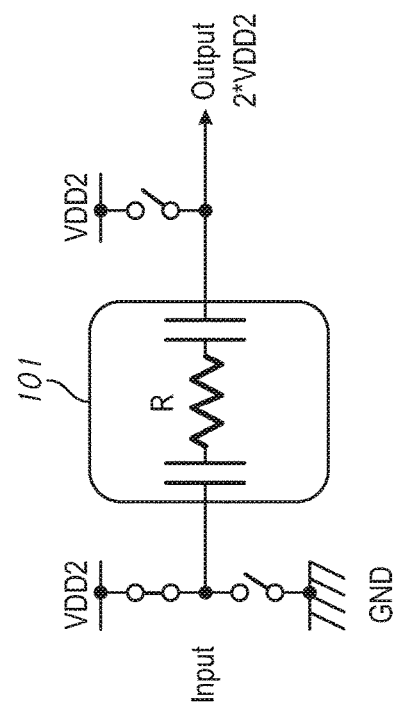

A capacitance block may be used as a charge pump. The charge pump may be desired to have stable current characteristics. FIGS. 10A and 10B are simplified circuit diagrams of a capacitance block operating as a charge pump 101, in accordance with an embodiment of the present disclosure. For example, a charge pump 101 may be a capacitance block 80 in FIG. 8B. The charge pump 101 may provide a positive power supply voltage VDD2 on an output node when an input node of the charge pump 101 is coupled to a ground potential (GND) and an output node is coupled to the positive power supply voltage VDD2. On the other hand, the charge pump 101 may provide a positive power supply voltage n*VDD2 (where n is a positive number larger than 1 including decimals and fractions, [for example, when n=2, n*VDD2 is twice as large as the positive power supply voltage VDD2]), on the output node if the input node of the charge pump 101 is coupled to the positive power supply voltage VDD2. Thus, the capacitance block 101 as the charge pump may convert a voltage of the output node responsive to a voltage of the input node.

Channel types of transistors used in the embodiments described the above are merely examples. However, in other embodiments, combinations of the channel types of transistors other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. A semiconductor device comprising:
   first, second, third, and fourth capacitors disposed adjacent to each other, wherein the second capacitor is sandwiched between the first and third capacitors, each of the first, second, third, and fourth capacitors including first and second electrodes,
   wherein the first electrodes of the first, second, third, and fourth capacitors are coupled in common to one another,
   wherein the second electrodes of the first and third capacitors are coupled in common to each other, and
   wherein the second electrodes of the second capacitor and the fourth capacitor are electrically insulated from the second electrodes of the first and third capacitors, and
   wherein the third capacitor is sandwiched between the second capacitor and the fourth capacitor.

2. The device as claimed in claim 1, wherein the second electrode of the second capacitor is configured to receive a first voltage, and
   wherein each of the second electrodes of the first and third capacitors is configured to receive a second voltage that is different from the first voltage.

3. The device as claimed in claim 1, further comprising:
   first and second power supply lines configured to provide first and second power voltages, respectively, the first power supply line being coupled in common to the second electrodes of the first and third capacitors, and the second power supply line being coupled to the second electrode of the second capacitor.

4. The device as claimed in claim 1, wherein each of the first, second, third, and fourth capacitors comprises a cylindrical capacitor.

5. The device of claim 1, wherein a size of the second electrode of the first capacitor and a size of the second electrode of the second capacitor are the same.

6. The device of claim 1, wherein a size of the second electrode of the first capacitor and a size of the second electrode of the third capacitor are the same.

7. The device of claim 1, wherein a size of the second electrode of the first capacitor and a size of the second electrode of the second capacitor are different.

8. The device of claim 1, wherein a size of the second electrode of the first capacitor and a size of the second electrode of the second capacitor are different.

9. The device of claim 1, further comprising an input node coupled to the first capacitor and an output node coupled to the second capacitor,
   wherein a combination of the first capacitor and the second capacitor is configured to convert a voltage of the output node responsive to a voltage of the input node.

10. A device comprising:
    a first circuit comprising first and second capacitors coupled in parallel to each other;
    a second circuit comprising a third capacitor; and
    first and second voltage lines;
    wherein the first and second circuits are coupled in series with each other between the first and second voltage lines, and
    wherein the first, second and third capacitors are disposed adjacent to each other in a first direction, and wherein the third capacitor is sandwiched between the first and second capacitors, and wherein the second capacitor is sandwiched between the third capacitor and a fourth capacitor.

11. The device of claim 10, further comprising a transistor comprising a source region and a drain region coupled, in common, to the second electrodes of the first and third capacitors and a gate coupled to the second electrode of the second capacitor.

12. A device comprising:
    a first circuit comprising first and second capacitors coupled in parallel to each other;
    a second circuit comprising a third capacitor; and
    first and second voltage lines;
    wherein the first and second circuits are coupled in series with each other between the first and second voltage lines, and
    wherein the first, second and third capacitors are arranged in a first direction and the third capacitor is sandwiched between the first and second capacitors,
    wherein the second circuit further comprises a fourth capacitor coupled in parallel to the third capacitor, and
    wherein the fourth capacitor is arranged in the first direction and the second capacitor is sandwiched between the third and fourth capacitors.

13. The device of claim 12, further comprising an input node coupled to the second electrodes of the first and third capacitors and an output node coupled to the second electrode of the second capacitor,
    wherein a combination of the first capacitor, the second capacitor and the second capacitor is configured to convert a voltage of the output node responsive to a voltage of the input node.

14. A device comprising:
    a first circuit coupled to a first voltage line;
    a second circuit coupled to a second voltage line;
    a first capacitor comprising a first pad electrode coupled to the first voltage line;

a second capacitor disposed adjacent to and coupled in parallel to the first capacitor, the second capacitor comprising a second pad electrode;

a third capacitor disposed adjacent to the second capacitor, the third capacitor comprising a third pad electrode coupled to the second voltage line; and a capacitance plate electrode; and a fourth capacitor coupled in parallel to the third capacitor, wherein the second capacitor is sandwiched between the third capacitor and the fourth capacitor;

wherein the capacitance plate electrode is configured to form the first, second and third capacitors with the first, second and third pad electrodes, respectively.

15. The device of claim 14, further comprising a third voltage line configured to provide a third voltage, wherein the second pad electrode is coupled to the third voltage line, and wherein the first circuit is further coupled to the third voltage line.

16. The device of claim 14, wherein the second circuit is arranged in a first direction from the first circuit, wherein the first pad electrode and the second pad electrode are arranged in a second direction substantially perpendicular to the first direction; and wherein the first pad electrode and the third pad electrode are arranged in the first direction.

17. The device of claim 14, wherein the second circuit is arranged in a first direction from the first circuit, wherein the first pad electrode, the second pad electrode and the third pad electrode are arranged in a second direction substantially perpendicular to the first direction.

18. The device of claim 17, wherein the first voltage line and the second voltage line extend in the first direction.

19. The device of claim 17, wherein the first voltage line extends in the second direction, and wherein the first voltage line is further coupled to the second pad electrode.

20. A device comprising:

a first circuit coupled to a first voltage line;

a second circuit coupled to a second voltage line, wherein the second circuit is arranged in a first direction from the first circuit;

a first capacitor comprising a first pad electrode coupled to the first voltage line;

a second capacitor coupled in parallel to the first capacitor, the second capacitor comprising a second pad electrode;

a third capacitor comprising a third pad electrode coupled to the second voltage line;

a capacitance plate electrode, wherein the capacitance plate electrode is configured to form the first, second and third capacitors with the first, second and third pad electrodes, respectively, wherein the first pad electrode, the second pad electrode and the third pad electrode are arranged in a second direction substantially perpendicular to the first direction; and a fourth capacitor coupled in parallel to the third capacitor, the fourth capacitor comprising a fourth pad electrode, wherein the fourth pad electrode is coupled to a third voltage line coupled to the second circuit.

* * * * *